(12) United States Patent
Park et al.

(10) Patent No.: US 10,854,561 B2
(45) Date of Patent: **\*Dec. 1, 2020**

(54) SEMICONDUCTOR PACKAGE

(71) Applicant: SAMSUNG ELECTRONICS CO., LTD., Suwon-si (KR)

(72) Inventors: Mi Jin Park, Suwon-si (KR); Ji Eun Park, Suwon-si (KR); Job Ha, Suwon-si (KR)

(73) Assignee: SAMSUNG ELECTRONICS CO., LTD., Suwon-si (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 16/786,782

(22) Filed: Feb. 10, 2020

(65) Prior Publication Data

US 2020/0235058 A1 Jul. 23, 2020

Related U.S. Application Data

(63) Continuation of application No. 16/181,011, filed on Nov. 5, 2018, now Pat. No. 10,559,541.

(30) Foreign Application Priority Data

Jun. 22, 2018 (KR) .......................... 10-2018-0071968

(51) Int. Cl.
*H01L 23/495* (2006.01)
*H01L 23/00* (2006.01)
(Continued)

(52) U.S. Cl.
CPC ........ *H01L 23/562* (2013.01); *H01L 23/3107* (2013.01); *H01L 23/5383* (2013.01);
(Continued)

(58) Field of Classification Search
CPC combination set(s) only.
See application file for complete search history.

(56) References Cited

U.S. PATENT DOCUMENTS 8,017,515 B2 9/2011 Marimuthu et al.
8,304,867 B2 11/2012 McCarthy et al.
(Continued)

FOREIGN PATENT DOCUMENTS

KR 10-2005-0087840 A 8/2005
KR 10-2010-0039895 A 4/2010
(Continued)

OTHER PUBLICATIONS

Communication dated Oct. 30, 2019, issued by the Korean Intellectual Property Office in corresponding Korean Application No. 10-2018-0071968.
(Continued)

*Primary Examiner* — Niki H Nguyen
(74) *Attorney, Agent, or Firm* — Sughrue Mion, PLLC

(57) ABSTRACT

A semiconductor package includes: a connection member including a plurality of connection pads and a redistribution layer; a semiconductor chip disposed on the connection member; an encapsulant sealing the semiconductor chip; a passivation layer disposed on the connection member; a plurality of under bump metallurgy (UBM) pads disposed on the passivation layer; and a plurality of UBM vias connecting the plurality of UBM pads to the plurality of connection pads, respectively, wherein the plurality of UBM pads include a first UBM pad overlapped with the semiconductor chip in a stacking direction, and a second UBM pad located outside of the overlapped region, and the first connection pad has an area larger than an area of an associated first UBM pad while the associated first UBM pad is overlapped
(Continued)

in the stacking direction, and has an area larger than an area of the second connection pad.

20 Claims, 12 Drawing Sheets

(51) Int. Cl.
*H01L 23/31* (2006.01)
*H01L 23/538* (2006.01)

(52) U.S. Cl.
CPC ...... *H01L 23/5386* (2013.01); *H01L 23/5389* (2013.01); *H01L 24/20* (2013.01); *H01L 2224/214* (2013.01); *H01L 2924/3512* (2013.01)

(56) References Cited

U.S. PATENT DOCUMENTS

| | | | | |
|---|---|---|---|---|
| 9,824,990 | B2* | 11/2017 | Chen | ............... H01L 23/49838 |
| 10,559,541 | B2* | 2/2020 | Park | ............... H01L 23/5386 |
| 2011/0108981 | A1 | 5/2011 | Rahim et al. | |
| 2012/0119388 | A1* | 5/2012 | Cho | ............... H01L 24/17 |
| | | | | 257/778 |
| 2013/0299966 | A1 | 11/2013 | Kumar et al. | |
| 2016/0260684 | A1* | 9/2016 | Zhai | ............... H01L 25/0652 |
| 2017/0287839 | A1 | 10/2017 | Lee et al. | |
| 2017/0338204 | A1 | 11/2017 | Lee et al. | |
| 2017/0373030 | A1 | 12/2017 | Lee et al. | |
| 2018/0102322 | A1 | 4/2018 | Kang et al. | |
| 2018/0138029 | A1 | 5/2018 | Kim et al. | |
| 2018/0166396 | A1 | 6/2018 | Lee et al. | |

FOREIGN PATENT DOCUMENTS

| | | |
|---|---|---|
| KR | 10-2017-0112372 A | 10/2017 |
| KR | 10-2018-0000653 A | 1/2018 |
| KR | 10-2018-0039524 A | 4/2018 |
| TW | 201820568 A | 6/2018 |
| WO | 2004/059708 A2 | 7/2004 |
| WO | 2009/016531 A2 | 2/2009 |

OTHER PUBLICATIONS

Office Action dated Aug. 19, 2019 by the Korean Intellectual Property Office in counterpart Korean Patent Application No. 10-2018-0071968.

Office Action dated Aug. 19, 2019 by the Taiwan Intellectual Property Office in counterpart Taiwan Patent Application No. 107138865.

* cited by examiner

I-I'

US 10,854,561 B2

1

SEMICONDUCTOR PACKAGE

CROSS-REFERENCE TO RELATED APPLICATION

This application is a continuation of U.S. patent application Ser. No. 16/181,011 filed Nov. 5, 2018, which claims priority from Korean Patent Application No. 10-2018-0071968, filed on Jun. 22, 2018 with the Korean Intellectual Property Office, the entire contents of each of which are herein incorporated by reference in their entireties.

BACKGROUND

The present disclosure relates to a semiconductor package.

In recent years, a packaging technique for achieving lightweight and simplified products has been actively studied, but a heat cycle or impact reliability in a manufacturing process or the use environment is significant.

In detail, such a reliability problem may be caused intensively at a contact point between dissimilar materials. Cracking occurring in an electrical connection structure such as a conductive bump and around the electrical connection structure is typical, and such cracking may be propagated to a connection member equipped with a redistribution layer, which may seriously degrade reliability of a semiconductor package.

SUMMARY

An aspect of the present disclosure provides a semiconductor package capable of reducing a decrease in reliability caused by cracking in an electrical connection structure and/or around a UBM layer.

According to an aspect of the present disclosure, a semiconductor package includes: a connection member having a first surface and a second surface opposing each other, and including a plurality of connection pads located on the second surface and a redistribution layer connected to the plurality of connection pads; a semiconductor chip disposed on the first surface of the connection member and having a connecting electrode connected to the redistribution layer; an encapsulant disposed on the first surface of the connection member and sealing the semiconductor chip; a passivation layer disposed on the second surface of the connection member; a plurality of under bump metallurgy (UBM) pads disposed on the passivation layer; a plurality of UBM vias passing through the passivation layer, and connecting the plurality of UBM pads to the plurality of connection pads, respectively; and a plurality of electrical connection structures disposed on the plurality of UBM pads, respectively. The plurality of OEM pads include a first UBM pad located in a region overlapped with the semiconductor chip in a stacking direction of the semiconductor chip and the connection member, and a second UBM pad located outside of the overlapped region, the plurality of connection pads include a first connection pad associated with the first UBM pad and a second connection pad associated with the second UBM pad, and the first connection pad has an area larger than an area of an associated first UBM pad while the associated first UBM pad is overlapped in the stacking direction, and has an area larger than an area of the second connection pad.

According to an aspect of the present disclosure, a semiconductor package includes: a connection member having a first surface and a second surface opposing each other, and

2 including a plurality of connection pads located on the second surface and a redistribution layer connected to the plurality of connection pads; a semiconductor chip disposed on the first surface of the connection member and having a connecting electrode connected to the redistribution layer; an encapsulant disposed on the first surface of the connection member and sealing the semiconductor chip; an insulating layer disposed on the second surface of the connection member; a plurality of UBM layers disposed on the insulating layer and electrically connected to the connection pad; and a plurality of electrical connection structures disposed on the plurality of UBM layers, respectively. Each of the plurality of connection pads has an area larger than an area of an associated UBM layer while the associated UBM layer is overlapped with one of the plurality of connection pads in a stacking direction of the semiconductor chip and the connection member, the plurality of UBM layers include a first UBM layer located in a region overlapped with the semiconductor chip in the stacking direction and a second UBM layer located outside of the overlapped region, the plurality of connection pads include a first connection pad associated with the first UBM layer and a second connection pad associated with the second UBM layer, and the first connection pad has an area larger than an area of the second connection pad.

According to an aspect of the present disclosure, a semiconductor package includes: a connection member having a first surface and a second surface opposing each other, and including a plurality of connection pads located on the second surface and a redistribution layer connected to the plurality of connection pads; a semiconductor chip disposed on the first surface of the connection member and having a connecting electrode connected to the redistribution layer; an encapsulant disposed on the first surface of the connection member and sealing the semiconductor chip; a passivation layer disposed on the second surface of the connection member; a plurality of under bump metallurgy (UBM) pads disposed on the passivation layer; a plurality of UBM vias passing through the passivation layer, and connecting the plurality of UBM pads to the plurality of connection pads, respectively; and a plurality of electrical connection structures disposed on the plurality of UBM pads, respectively. The plurality of UBM pads include a first UBM pad located in a region overlapped with the semiconductor chip in a stacking direction of the semiconductor chip and the connection member and a second UBM pad located outside of the overlapped region, the plurality of connection pads include a first connection pad associated with the first UBM pad and a second connection pad associated with the second UBM pad, the first connection pad has a first region extending outward from a boundary of a second region overlapped with the associated first UBM pad, and the second connection pad has a third region extending outward from a boundary of a fourth region overlapped with the associated second UBM pad, and a width of the first region of the first connection pad is greater than a width of the third region of the second connection pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
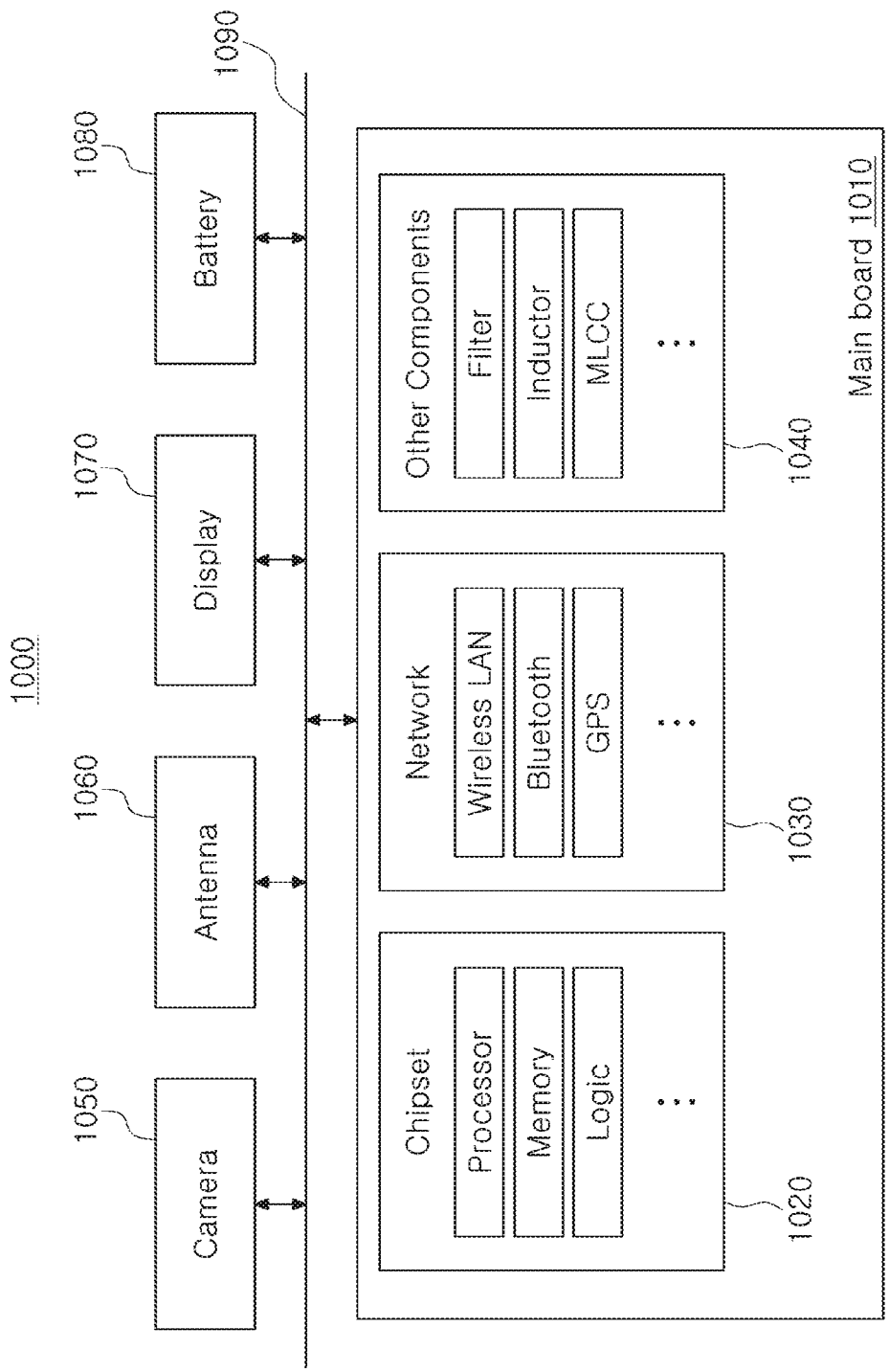
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being 'on,' connected t or 'coupled to' another element, it can be directly 'on,' 'connected to,' or 'coupled to' the other element or other elements intervening therebetween may be present. In contrast, when an element is referred to as being 'directly on,' directly connected to,' or 'directly coupled to' another element, there may be no other elements or layers intervening therebetween. Like numerals refer to like elements throughout. As used herein, the term 'and/or' includes any and all combinations of one or more of the associated listed items.

It will be apparent that although the terms first, second, third, etc. may be used herein to describe various members, components, regions, layers and/or sections, any such members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as 'above,' upper,' 'below,' and 'lower' and the like, may be used herein for ease of description to describe one element's relationship relative to another element(s) as shown in the figures. It will be understood that spatially relative terms are intended to encompass different orientations of the device in use or operation, in addition to the orientation depicted in the figures. For example, if the device in the figures is turned over, elements described as 'above,' or 'upper' relative to other elements would then be oriented 'below,' or 'lower' relative to the other elements or features. Thus, the term 'above' can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms 'a,' 'an,' and 'the' are intended to include the plural forms as well, unless the context clearly indicates otherwise. It will be further understood that the terms 'comprises,' and/or 'comprising' when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted alone, in combination or in partial combination.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, or the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like; or the like. However, the chip related components 1020 are not limited thereto, and may include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless or wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
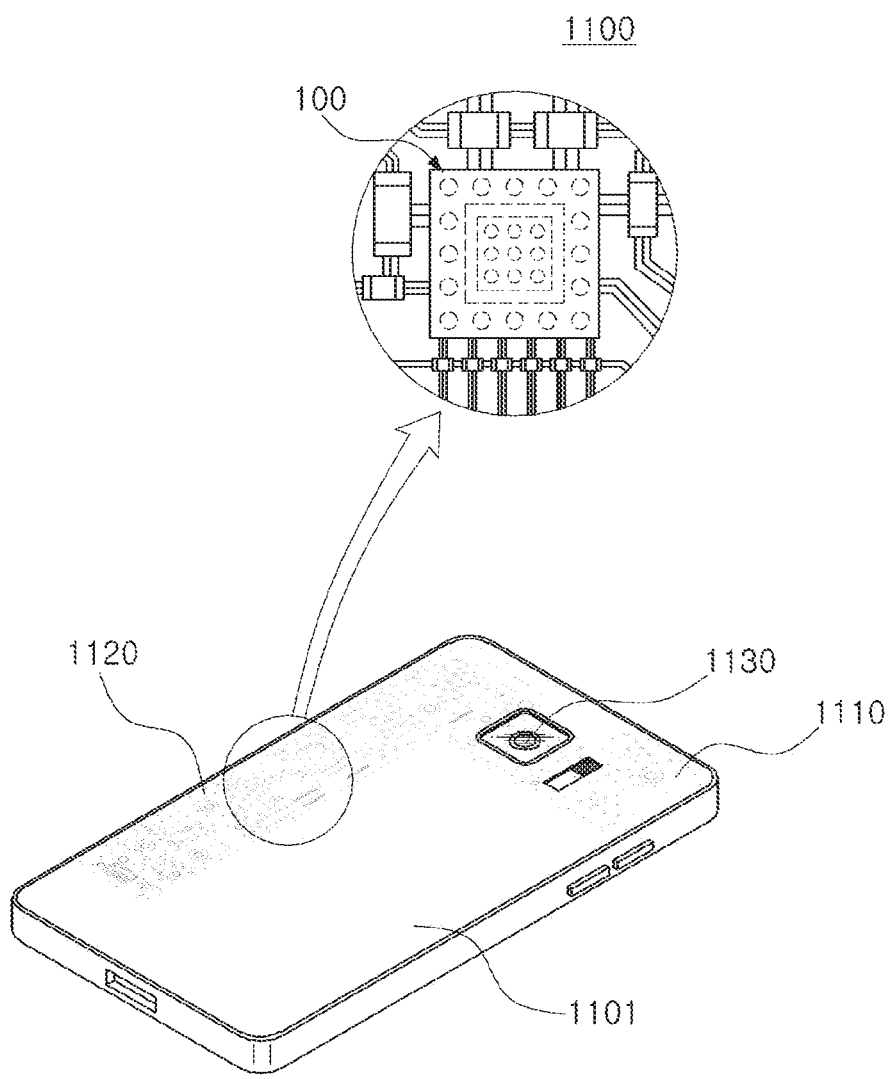
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be chip related components, and a semiconductor package 100 may be, for example, an application processor among the chip related components, but is not, limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in circuit widths between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the attached drawings.

Fan-In Semiconductor Package

Figure 3B:
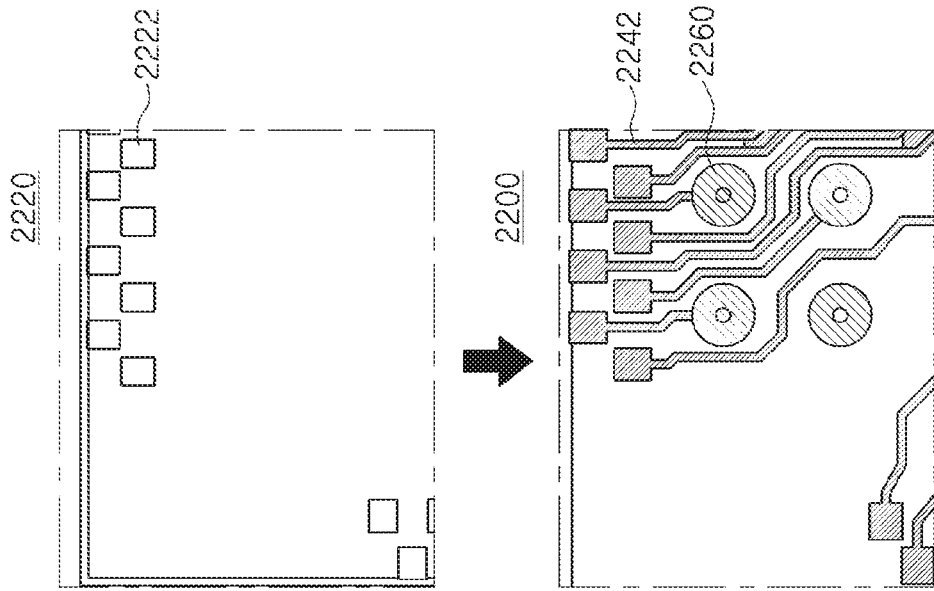
FIGS. 3A and 3B are schematic cross-sectional views illustrating states of a fan-in semiconductor package before and after being packaged.
Figure 3A:
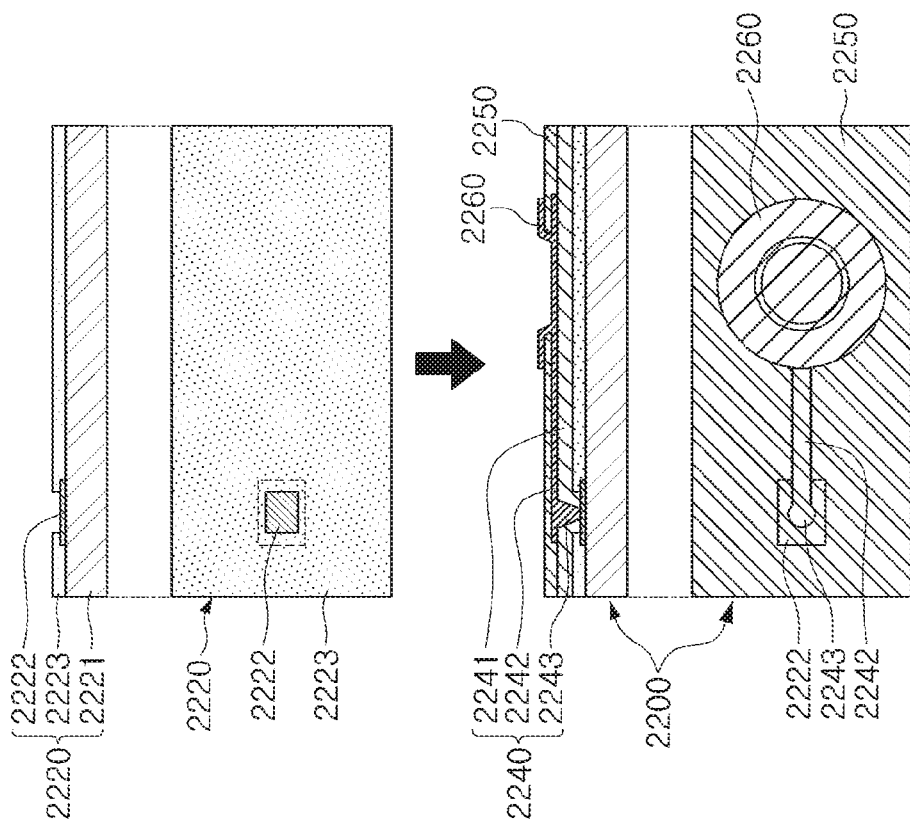
Figure 4:
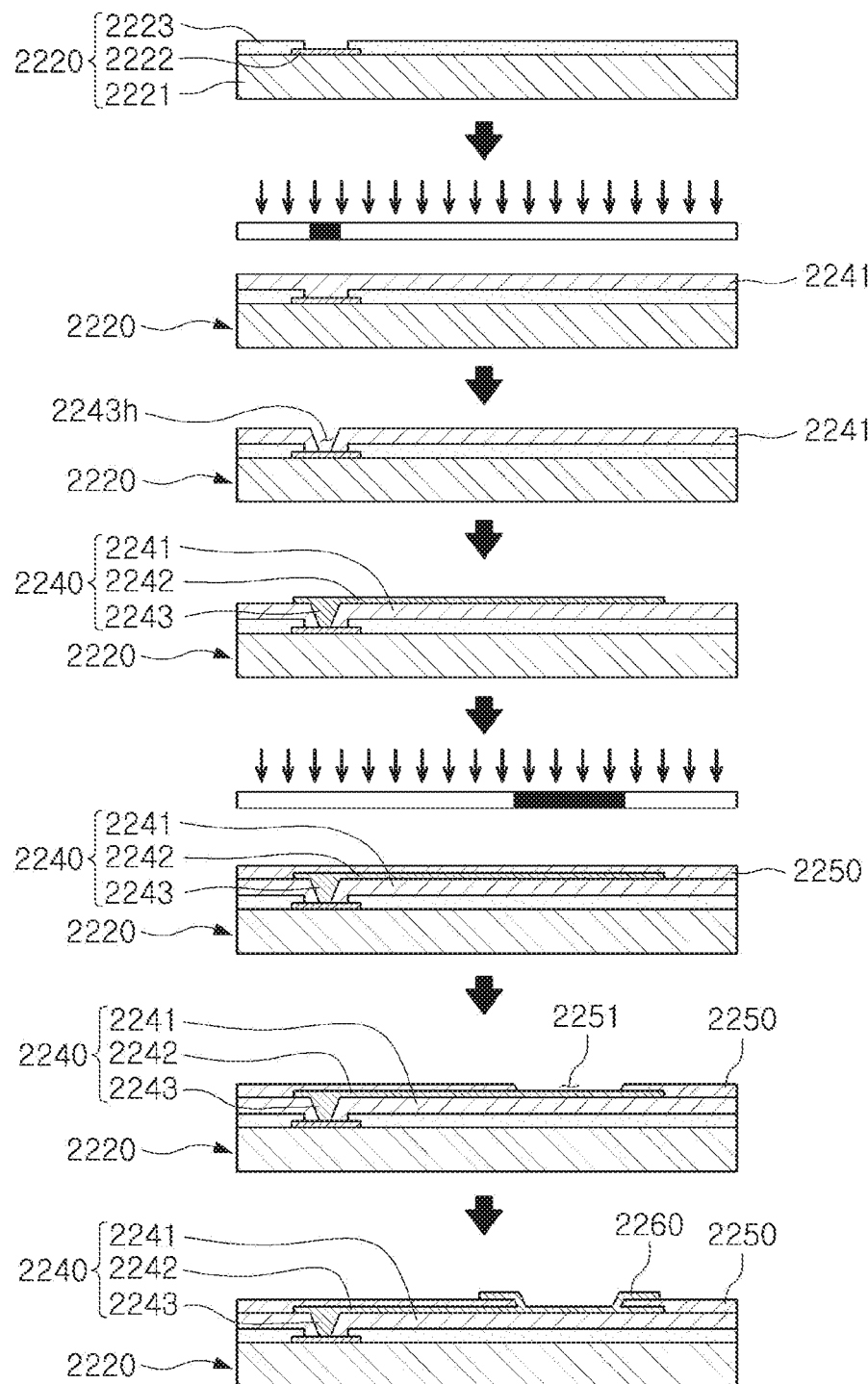
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A, 3B and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. Since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243*h* exposing the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. Here, even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
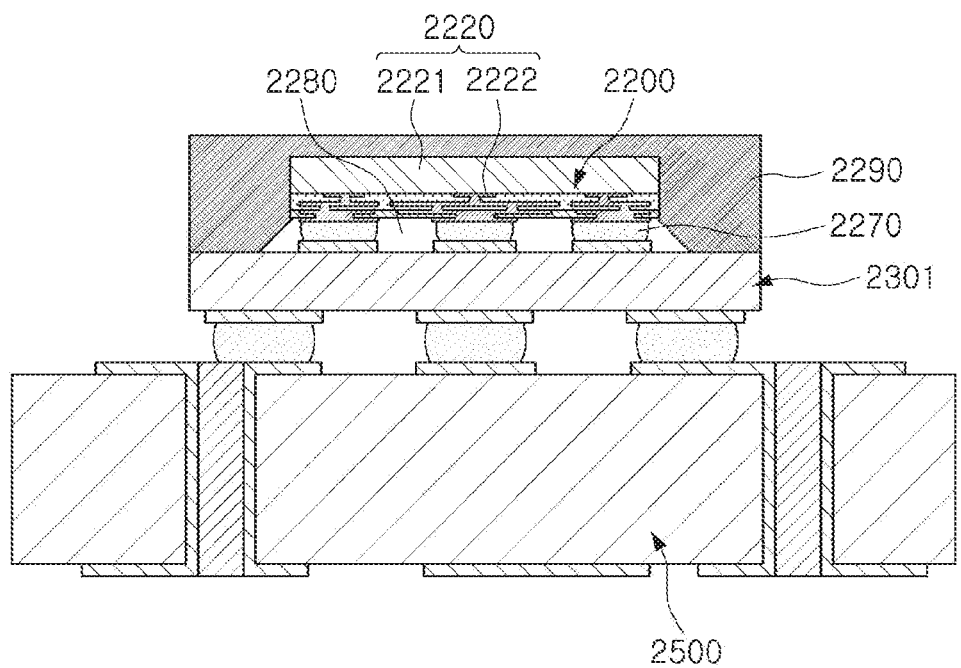
FIG. 5 is a schematic cross-sectional view illustrating a case in which a fan-in semiconductor package is mounted on an interposer substrate and is ultimately mounted on a mainboard of an electronic device.
Figure 6:
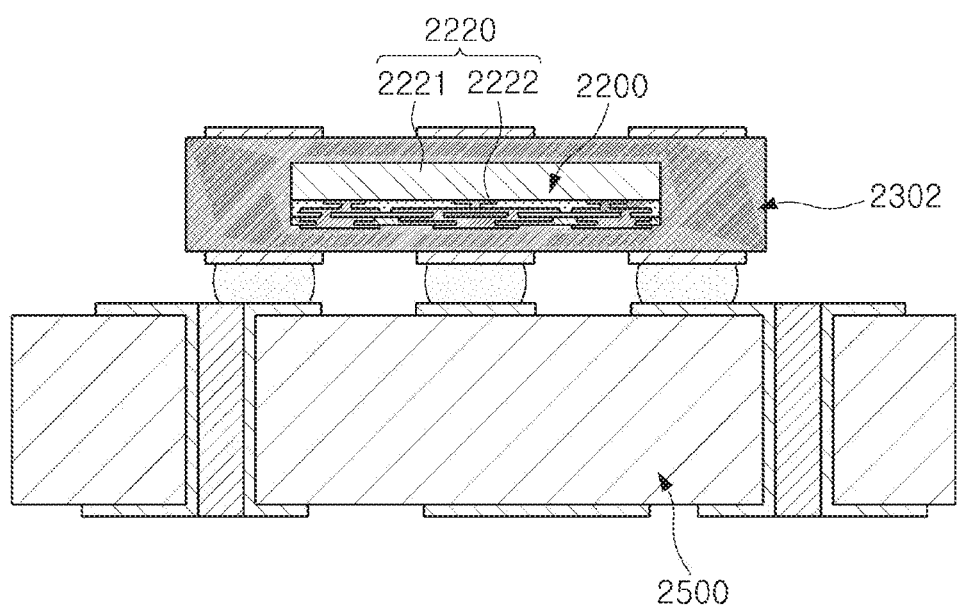
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may ultimately be mounted on a mainboard 2500 of an electronic device in a state in which it is mounted on the interposer substrate 2301. In this case, low melting point metal or alloy balls 2210, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may ultimately be mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

FIG. is a schematic cross-sectional view illustrating a fan-out semiconductor package.

Figure 7:
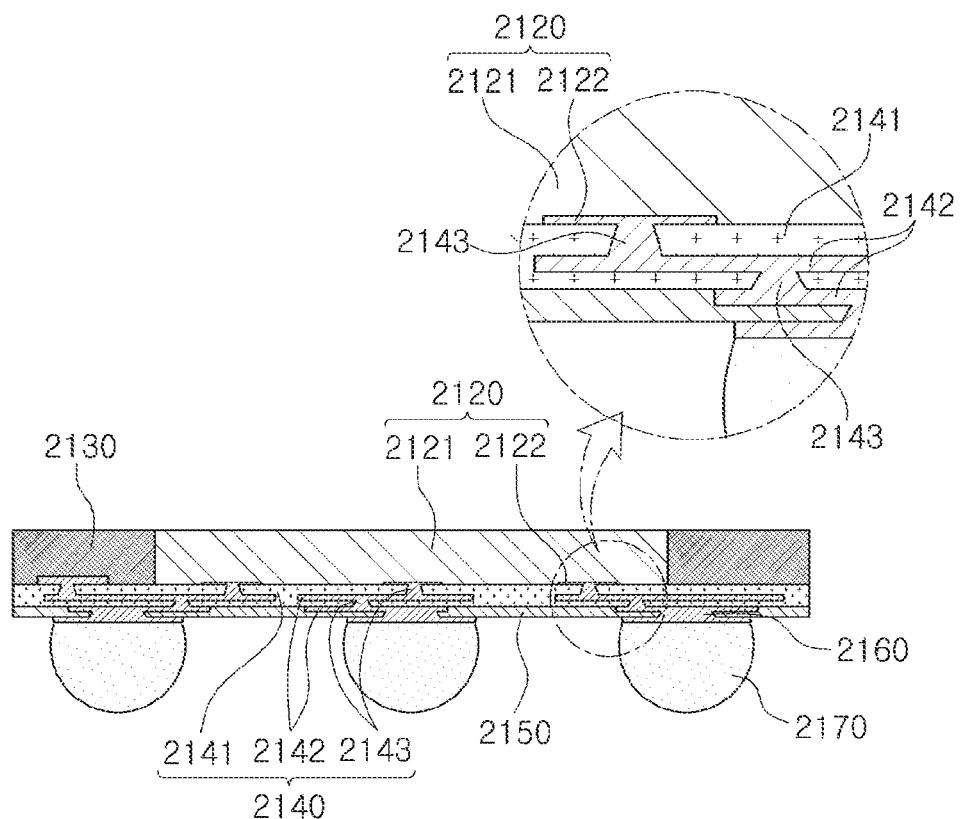
FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Low melting point metal or alloy balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, a redistribution layer 2142 formed on the insulating layer 2141, and a via 2143 electrically connecting the connection pad 2122 to the redistribution layer 2142.

In the manufacturing process described above, after the encapsulant 2130 is formed outside of the semiconductor chip 2120, the connection member 2140 may be provided. In this case, since forming the connection member 2140 is performed after the semiconductor chip 2120 is sealed, the via 2143, connected to a redistribution layer, may be formed to have a width which becomes smaller toward the semiconductor chip 2120 (See an enlarged area).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
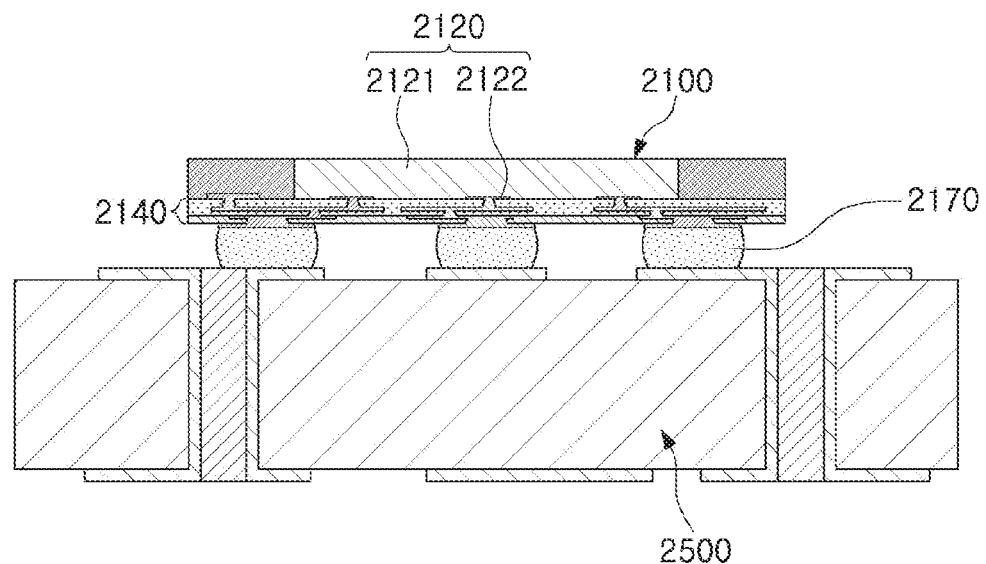
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal or alloy balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, exemplary embodiments of the present disclosure will be described in more detail with reference to the attached drawings.

Figure 9:
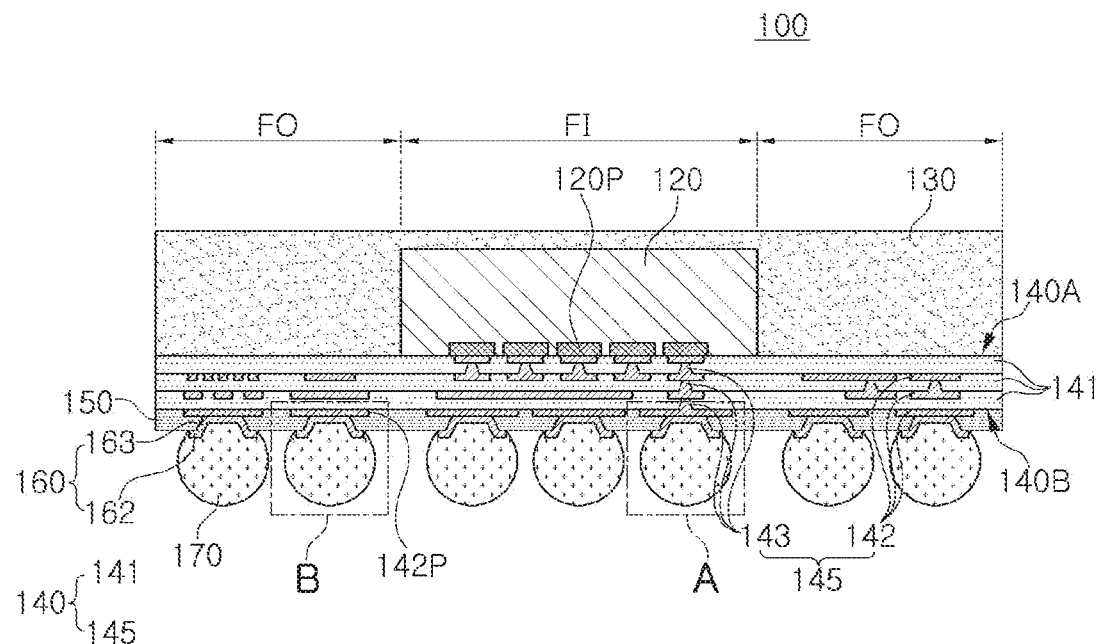
FIG. 9 is a schematic cross-sectional view of a semiconductor package according to an exemplary embodiment of the present disclosure.
Figure 10:
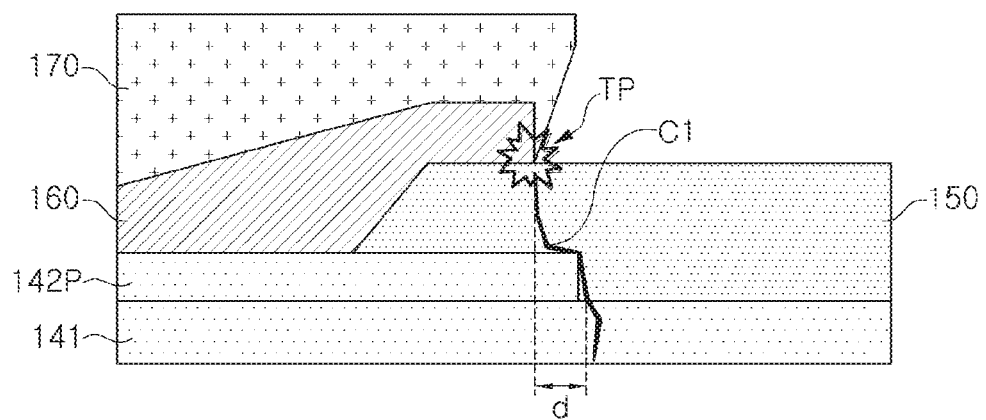
FIG. 10 is a schematic diagram to describe the principle of preventing crack propagation in a semiconductor package according to an exemplary embodiment of the present disclosure.
Figure 11A:
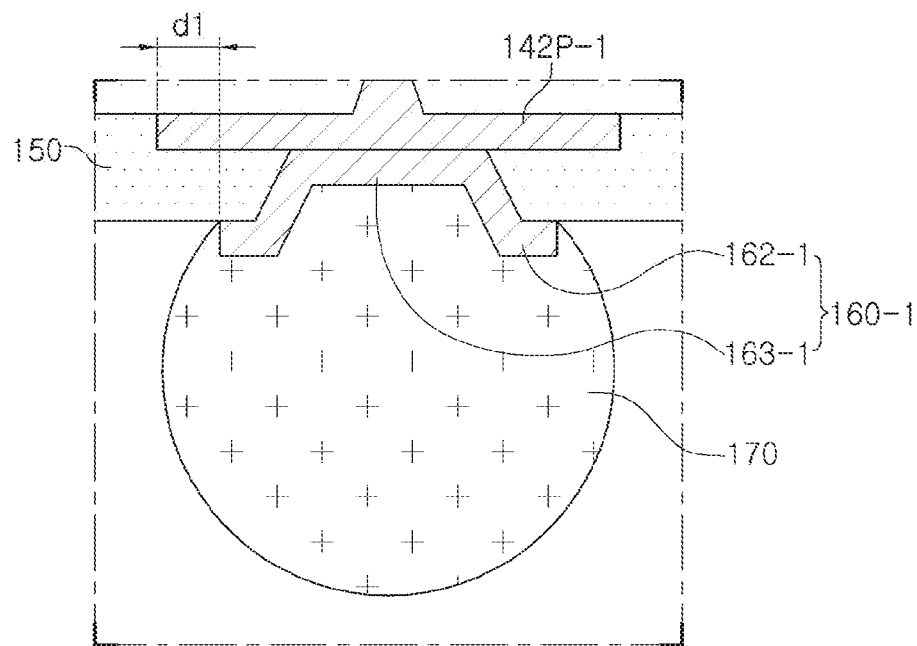
FIGS. 11A and 11B are enlarged cross-sectional views illustrating portions A and B of a semiconductor package according to an exemplary embodiment of the present disclosure, respectively.
Figure 11B:
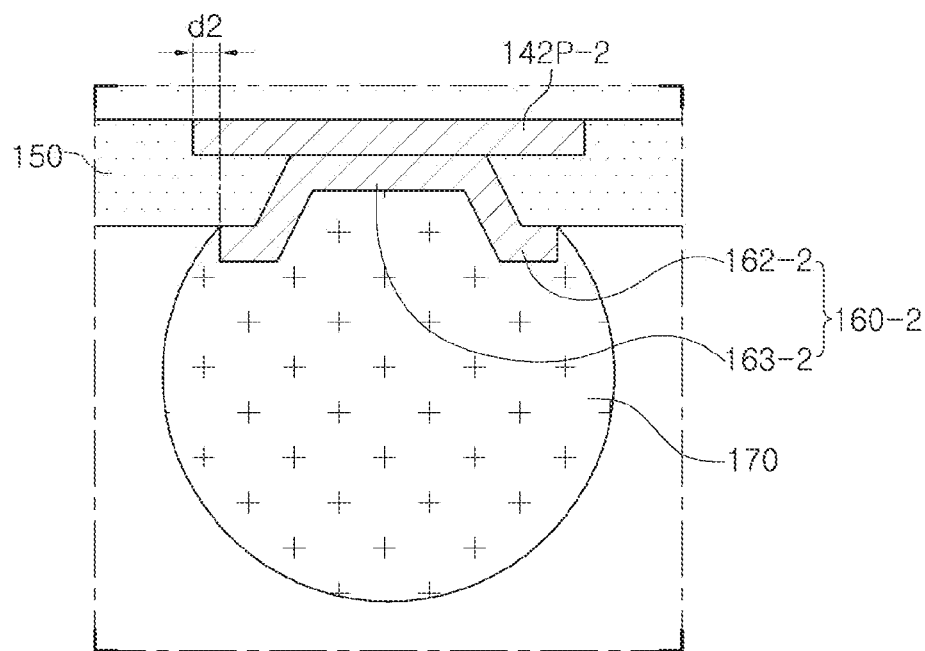
Figure 12:
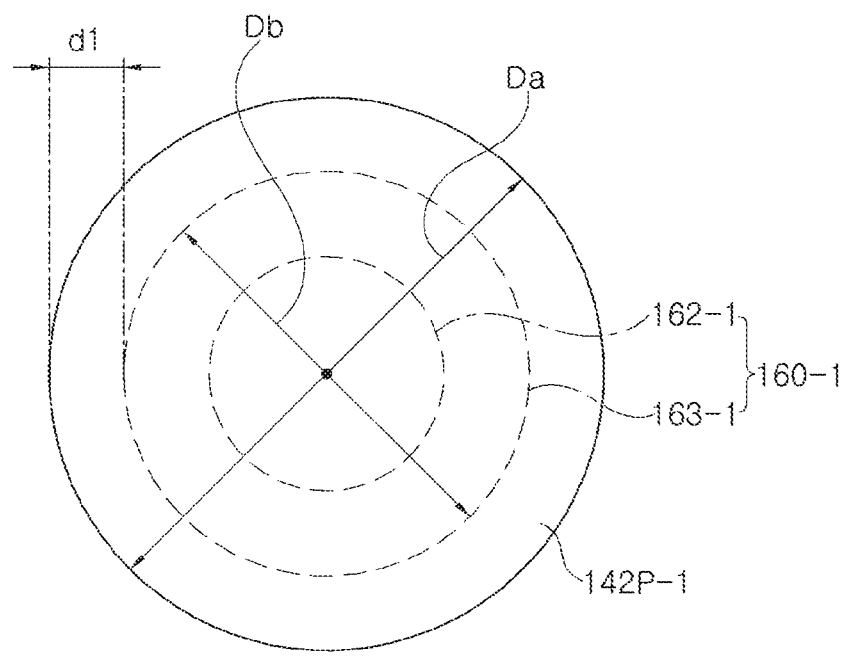
FIG. 12 is an overlap view illustrating a portion of the semiconductor package illustrated in FIG. 11A.

FIG. 9 is a schematic cross-sectional view illustrating a semiconductor package according to an exemplary embodiment, FIG. 10 is a schematic diagram to describe the principle of preventing crack propagation in a semiconductor package according to an exemplary embodiment of the present disclosure, FIGS. 11A and 11B are enlarged cross-sectional views illustrating portions A and B of a semiconductor package according to an exemplary embodiment, respectively, and FIG. 12 is an overlap view illustrating a portion C of the semiconductor package illustrated in FIG. 11A.

Referring to FIG. 9, a semiconductor package 100 according to an exemplary embodiment may include a connection member 140 having a first surface 140A and a second surface 140B, opposing each other, and including a redistribution layer (RDL) 145, a semiconductor chip 120 disposed on the first surface 140A of the connection member 140 and having a connecting electrode 120P connected to the redistribution layer 145, and an encapsulant 130 disposed on the first surface 140A of the connection member 140 and sealing the semiconductor chip 120.

The connection member 140 may include an insulating member 141 and a redistribution layer 145 formed in the insulating member 141. The redistribution layer 145 may include a redistribution pattern 142, and a redistribution via 143, connecting the redistribution pattern 142 to the connection pad 143 or another redistribution pattern 142 adjacent thereto.

The redistribution layer 145, applied to an exemplary embodiment, is illustrated to have a three-layer structure, located on different three levels in the insulating member 141, by way of example, but may include a single or multiple layer structure other than a three-layer structure. The redistribution layer 145 may be directly connected to a connection pad 120P (or a wiring structure of a supporting member according to another exemplary embodiment) of a semiconductor chip 120 through the redistribution via 143.

The connection member 140 may include a plurality of connection pads 142Q located on the second surface 140B and connected to the redistribution layer 145. The semiconductor package 100 may include a passivation layer 150 disposed on the second surface 140B of the connection member 140, and a under bump metallurgy (UBM) layer 160 connected to the plurality of connection pads 142P in the passivation layer 150. The UBM layer 160, applied to an exemplary embodiment, may include a plurality of UBM pads 162 disposed on the passivation layer 150, and a plurality of UBM vias 163 connecting the plurality of UBM pads 162 to the plurality of connection pads 142P, respectively, while passing through the passivation layer 150. The plurality of connection pads 142Q may have a form corresponding to a position in which the plurality of UBM pads 162 are located.

Moreover, a plurality of electrical connection structures 170 may be disposed on the plurality of UBM pads 162, respectively. The semiconductor package 100 may be mounted on a pad of a substrate such as a mainboard using the electrical connection structure 170. Here, the UBM layer 160 may suppress occurrence of cracking of the electrical connection structure 170, caused by thermal shock between the electrical connection structure 170 and the redistribution layer 145, thereby improving reliability.

Despite the structure described above, since components formed of various materials are used in a semiconductor package, thermal stress may occur due to a difference in thermal expansion coefficients between dissimilar materials. The thermal stress described above may be a cause of defects such as delamination or cracking between dissimilar materials. In detail, the thermal stress problem around the UBM layer 160 may be significant.

In detail, as illustrated in FIG. 10, there may be a triple point TP, a contact point, at which the UBM layer 160 is connected to the passivation layer 150 and the electrical connection structure 110, formed of different materials, in an edge of the UBM layer. The thermal stress, occurring due to a change in temperature, is concentrated on the triple point TP of the UBM layer 160, the passivation layer 150, and the electrical connection structure 170. As a result, cracking C1 may easily occur. The cracking C1, occurring from the triple point TP, may be propagated along the passivation layer 150 to the connection member 140, thereby causing damage to the redistribution layer 145. As a result, a fatal defect may be caused thereby.

As described above, to prevent the cracking C1 occurring from the triple point TP adjacent to the UBM layer 160 from causing damage to the redistribution layer 145, the inventors have proposed that the connection pad 142P be expanded to have a sufficient size. As illustrated in FIG. 10, the connection pad 142P may block cracking C1, propagated in a stacking direction, when the UBM layer 160, overlapped in the stacking direction, in detail, the UBM pad 162 is expanded by "d."

In terms of blocking propagation of cracking, it may be preferable to design the connection pad 142P expanded to have a larger area. However, the expansion of the connection pad may be limited by another adjacent circuit (for example, an adjacent connection pad). However, the inventors have proposed a method in which a region in which a relatively large amount of thermal stress may occur is specified and sufficient expansion of the connection pad 142P is selectively allowed within the region described above.

In detail, as illustrated in FIG. 9, one portion of the UBM layer 160 and the electrical connection structure 170 is located in a fan-in region FI overlapping the semiconductor chip 150, while the other portion of the UBM layer 160 and the electrical connection structure 170 may be disposed in a fan-out region FO.

The semiconductor chip 120 such as an application processor (AP) acts as a heat source, so a fan-in region FI, adjacent to the semiconductor chip 120, may be more exposed to stress due to difference in thermal expansion coefficients, as compared with a fan-out region FO.

FIGS. 11A and 11B are enlarged cross-sectional views illustrating a fan-in region "A" and a fan-out region "B" of a semiconductor package according to an exemplary embodiment of the present disclosure, respectively.

Referring to FIGS. 11A and 11B, together with FIG. 9, the plurality of UBM pads 163 may include a region overlapped with the semiconductor chip 120 in a stacking direction, that is, a first UBM layer 160-1, located in a fan-in region FI, and a region outside of the overlapped region, that is, a second UBM layer 160-2, located in a fan-out region FO. The first UBM layer 160-1 may include a first UBM pad 162-1 and a first UBM via 163-1, and the second UBM layer 160-2 may include a second UBM pad 162-2 and a second UBM via 163-2.

The plurality of connection pads 142P may include a first connection pad 142P-1 associated with the first UBM pad 163-1 and a second connection pad 142P-2 associated with the second UBM pad 163-2. In this specification, a connection pad, "associated with" a UBM pad, refers to a connection pad overlapping a specific UBM pad to be connected thereto.

In a fan-in region FI adjacent to a semiconductor chip 120, a heat source, to be significantly exposed to an effect of thermal stress, as illustrated in FIG. 11A, the first connection pad 142P-1 may have an area larger than an area of an associated first UBM pad 162-1 by a first expansion width d1 while the associated first UBM pad 162-1 overlaps in a stacking direction.

Moreover, an area of the first connection pad 142P-1 may be larger than an area of the second connection pad 142P-2 by a second expansion width (d2<d1). Alternatively, an expanding degree of the first connection pad 142P-1 with respect to the first UBM pad 162-1 may be larger than an expanding degree of the second connection pad 142P-2 with respect to the first UBM pad 162-1, i.e., d2<d1.

As described above, as the first connection pad 142P-1 is provided to selectively have a sufficient area, cracking, relatively easily occurring in a fan-in region FI, may be blocked more effectively. The first expansion width d1 of the first connection pad 142P-1 may be defined as a radius element, extended from a boundary of a region overlapped with the associated first UBM pad 162-1, and may be at least 20 μm.

A degree of expansion of the first connection pad 142P-1 may vary depending on the design of another redistribution layer 145 around the first connection pad. For example, depending on whether another redistribution layer 145 (in detail, a redistribution pattern 142) is disposed between adjacent first connection pads, an expansion range of the first connection pad 142P-1 may be limited.

When the redistribution layer 145 is disposed between adjacent first connection pads 142P-1, a diameter Da of the first connection pad 142P-1 may be 1.4 to 1.75 times a diameter Db of the associated first UBM pad 162-1 (see FIG. 12).

On the other hand, when the redistribution layer 145 is not disposed between adjacent first connection pads 142P-1, a diameter Da of the first connection pad 142P-1 may be 1.5 to 2 times a diameter Db of the associated first UBM pad 162-1 (see FIG. 12).

Hereinafter, each component of a semiconductor package according to an exemplary embodiment will be described in more detail.

The connection member 140 may include an insulating member 141 and a redistribution layer 145 formed in the insulating member 141, as described previously. For example, the insulating member 141 may include a photosensitive insulating material such as a PID resin, in addition to the insulating resin described previously. When the photosensitive insulating material is used, the insulating layer 141 may be provided further thinner, and a fine pitch of the redistribution via 143 may be achieved more easily. For example, in the case of each insulating layer forming the insulating member 141, a thickness thereof between patterns except for the redistribution pattern 142 may be about 1 μm to 10 μm.

The redistribution pattern 142 may perform various functions depending on designs of its corresponding layer. For example, the redistribution pattern 142 may include ground (GND) patterns, power (PWR) patterns, signal (S) patterns, and the like. Here, the S pattern may include various signals except for a GND pattern, a PWR pattern, or the like, for example, data signals, or the like. Moreover, the S pattern may include a via pad pattern, an electrical connection structure pad pattern, or the like. For example, the redistribution pattern 142 may include a conductive material such as copper (Cu), aluminum (Al), silver (Ag), tin (Sn), gold (Au), nickel (Ni), lead (Pb), titanium (Ti), or alloys thereof. For example, a thickness of the redistribution pattern 142 may be about 0.5 μm to 15 μm.

The redistribution via 143 may be used as an element (an interlayer connection element) connecting elements located on different levels (for example, a conductive trace and redistribution patterns or redistribution patterns of another insulating layer) in a vertical direction. For example, the redistribution via 143 may include a conductive material such as copper (Cu), aluminum (Al), silver (Ag), tin (Sn), gold (Au), nickel (Ni), lead (Pb), titanium (Ti), or alloys thereof.

The redistribution via 143 may be completely filled with a conductive material, or the conductive material may be formed along a wall of a via. For example, the redistribution via 143 may have various shapes such as a tapered or cylindrical shape.

Tens to hundreds of connection pads 120P of the semiconductor chip 120 may be redistributed, and may be physically and/or electrically connected to an external source according to a function thereof through the electrical connection structure 170. The UBM layer 160 may improve connection reliability of the electrical connection structure 170 to improve board level reliability of the semiconductor package 100. The UBM layer 160 is disposed in the passivation layer 150 to be connected to the redistribution pattern 142 of the connection member 140. The electrical connection structure 170 allows the semiconductor package 100 to be physically and/or electrically connected to an external source. For example, the semiconductor package 100 may be mounted on a main board of an electronic device through the electrical connection structure 170.

The electrical connection structure 170 may be formed of a conductive material, for example, a low melting point alloy such as a tin (Sn)-aluminum (AU-copper (Cu) alloy, but an exemplary embodiment is not limited thereto. The electrical connection structure 170 may be a land, a ball, a pin, or the like. The electrical connection structure 170 includes a single layer or a plurality of layers. When the electrical connection structure includes a plurality of layers, the electrical connection structure may include a copper (Cu) pillar and a low melting point alloy. The number, an interval, a disposition, or the like, of the electrical connection structure 170 is not particularly limited, and may be sufficiently modified by a person skilled in the art depending on design particulars.

Figure 13:
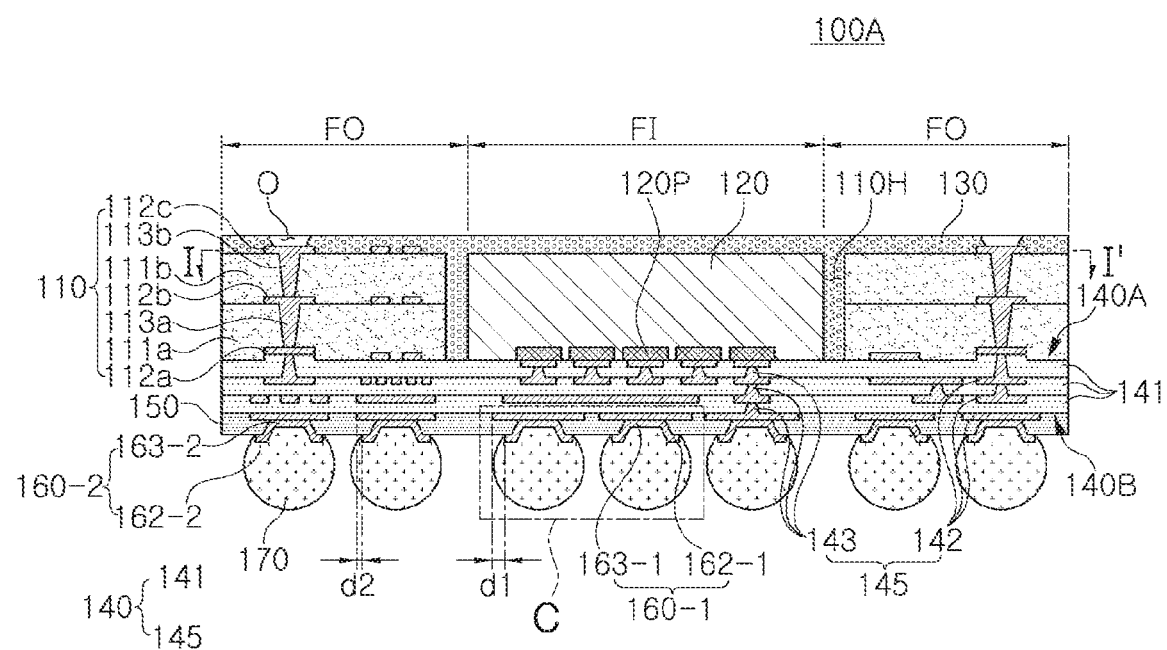
FIG. 13 is a schematic cross-sectional view of a semiconductor package according to an exemplary embodiment of the present disclosure.
Figure 14:
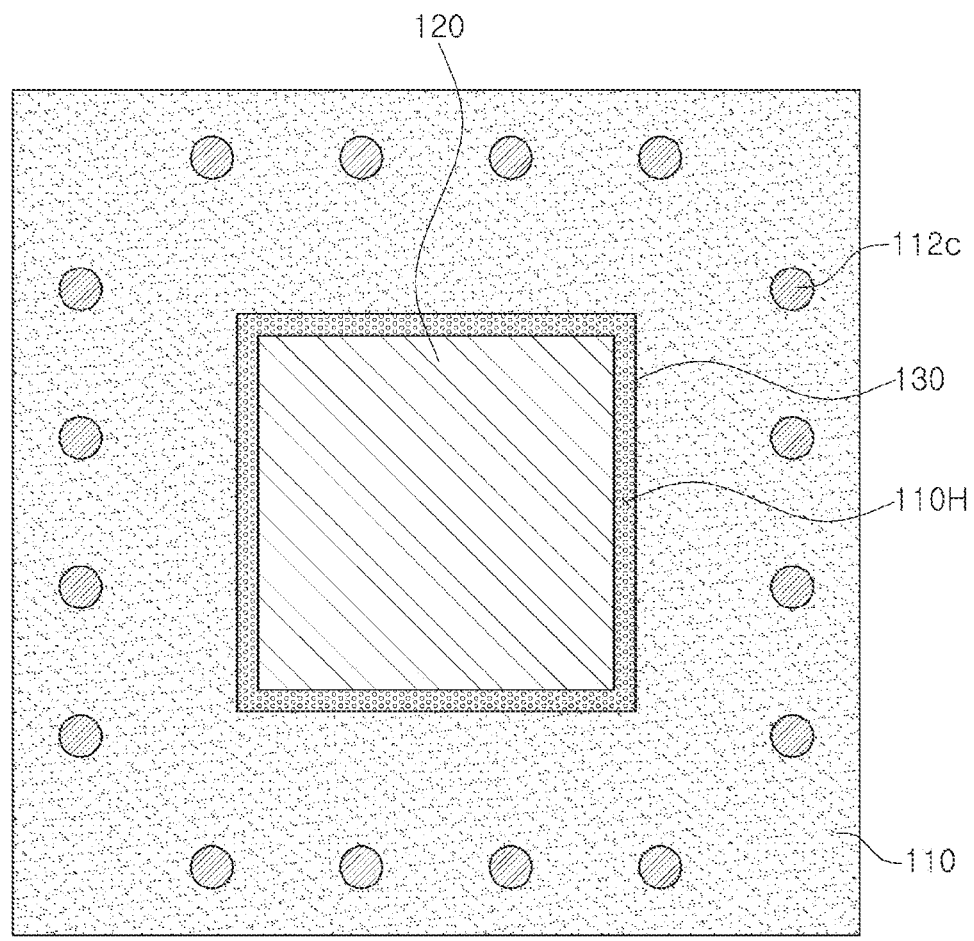
FIG. 14 is a plan view of the semiconductor package illustrated in FIG. 13 taken along line I-I'.

FIG. 13 is a schematic cross-sectional view illustrating a semiconductor package according to an exemplary embodiment, and FIG. 14 is a plan view of the semiconductor package illustrated in FIG. 13, taken along line I-I'.

Referring to FIGS. 13 and 14, a semiconductor package 100A according to an exemplary embodiment may be understood as being similar to the structure illustrated in FIG. 9, except that a supporting member 110 having a wiring structure is included. The description of the components according to an exemplary embodiment may be referred to the description of the same or similar components of the semiconductor package 100 illustrated in FIG. 9, unless specifically explained otherwise.

The semiconductor package 100A according to an exemplary embodiment may include a supporting member 110 having a cavity 110H for embedding a semiconductor chip 120. The supporting member 110 is disposed above the connection member 140 and has a wiring structure connected to the redistribution layer 145.

The supporting member 110, applied to an exemplary embodiment, may include a first dielectric layer 111a having one surface in contact with the connection member 140, a first wiring layer 112a embedded in one surface of the first dielectric layer 111a, a second wiring layer 112b disposed on the other surface of the first dielectric layer 111a, a second dielectric layer 111b disposed on the other surface of the first dielectric layer 111a to cover the second wiring layer 112b, and a third wiring layer 112c disposed on the second dielectric layer 111b. The first wiring layer 112a, the second wiring layer 112b, and the third wiring layer 112c may be also electrically connected to the connection pad 120P of a semiconductor chip by the redistribution layer 145.

The first wiring layer 112a and the second wiring layer 112b, as well as the second wiring layer 112h and the third wiring layer 112c may be electrically connected to each other through a first via 113a and a second via 113b, passing through a first dielectric layer 111a and a second dielectric layer 111b, respectively.

When the first wiring layer 112a is embedded in the first dielectric layer 111a, a step, generated due to a thickness of the first wiring layer 112a, may be significantly reduced, and an insulation distance of the connection member 140 may thus become constant. In other words, a difference between a distance from the redistribution pattern 142 of the connection member 140 to a lower surface of the first dielectric layer 111a, and a distance from the redistribution pattern 142 of the connection member 140 to the connection pad 120P of the semiconductor chip 120, may be less than a thickness of the first wiring layer 112a. Thus, a high-density wiring design of the connection member 140 may be easily performed.

A lower surface of the first wiring layer 112a of the supporting member 110 may be located above a lower surface of the connection pad 120P of the semiconductor chip 120. The first wiring layer 112a may be recessed inwardly of the dielectric layer 111, as described previously. As described above, when the first wiring layer 112a is recessed inwardly of the first dielectric layer 111a and a step is provided between a lower surface of the first dielectric layer 111a and a lower surface of the first wiring layer 112a, the first wiring layer 112a may be prevented from being contaminated by bleeding a formation material of the encapsulant 130.

The first dielectric layer 111a and the second dielectric layer 111b may include an insulating material. For example, the insulating material may include a thermosetting resin such as an epoxy resin, or a thermoplastic resin such as a polyimide resin. Alternatively, the insulating material may include a resin mixed with an inorganic filler or impregnated together with an inorganic filler in a core material such as a glass fiber, for example, prepreg, ABF, FR-4, BT, or the like. In a specific example, a PID resin may also be used.

Figure 15:
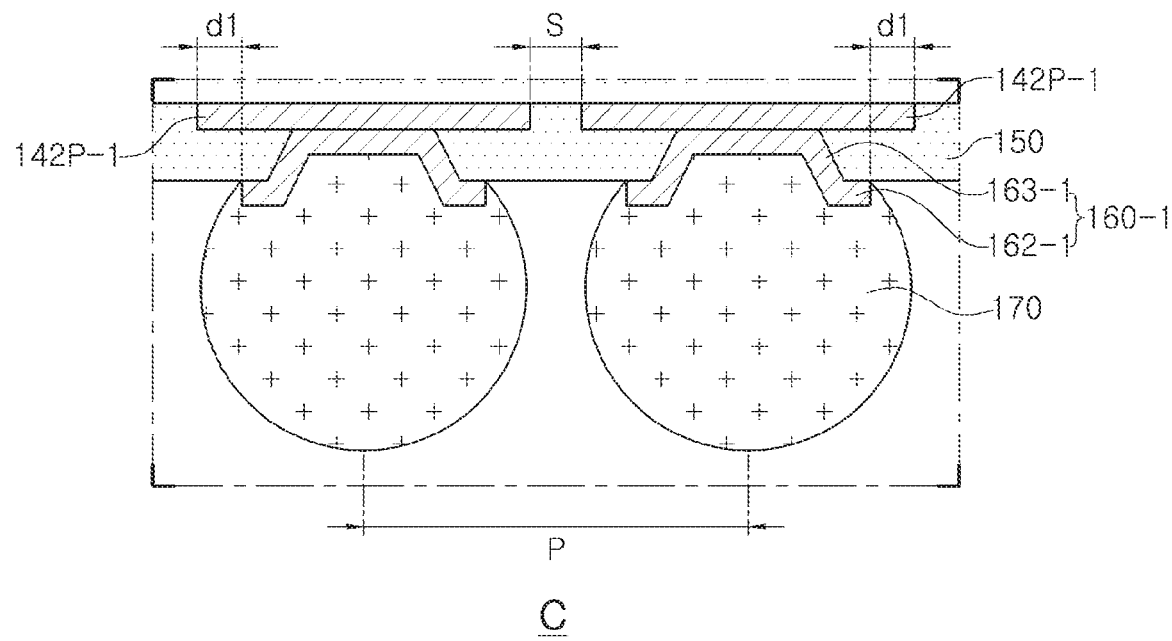
FIG. 15 is an enlarged cross-sectional view illustrating a portion C of the semiconductor package illustrated in FIG. 13.

In a fan-in region FI in which an effect of thermal stress is significant, as illustrated in FIG. 15, the first connection pad 142P-1 may have an area larger than an area of an associated first UBM pad 162-1 by a first expansion width d1 while the associated first UBM pad 162-1 overlaps in a stacking direction. As described previously, an area of the first connection pad 142P-1 may be larger than an area of a second connection pad located in a fan-out region FO.

Referring to FIG. 15, the redistribution layer 145 may not be disposed between adjacent first connection pads 142P-1, and the first connection pad 142P-1 may be sufficiently expanded to allow a distance S with an adjacent first connection pad 142P-1 of at least 10 μm to be secured. A diameter of the first connection pad 142P-1 is not limited thereto, but may be 1.4 to 1.15 times a diameter of the associated first UBM pad 162-1.

Figure 16:
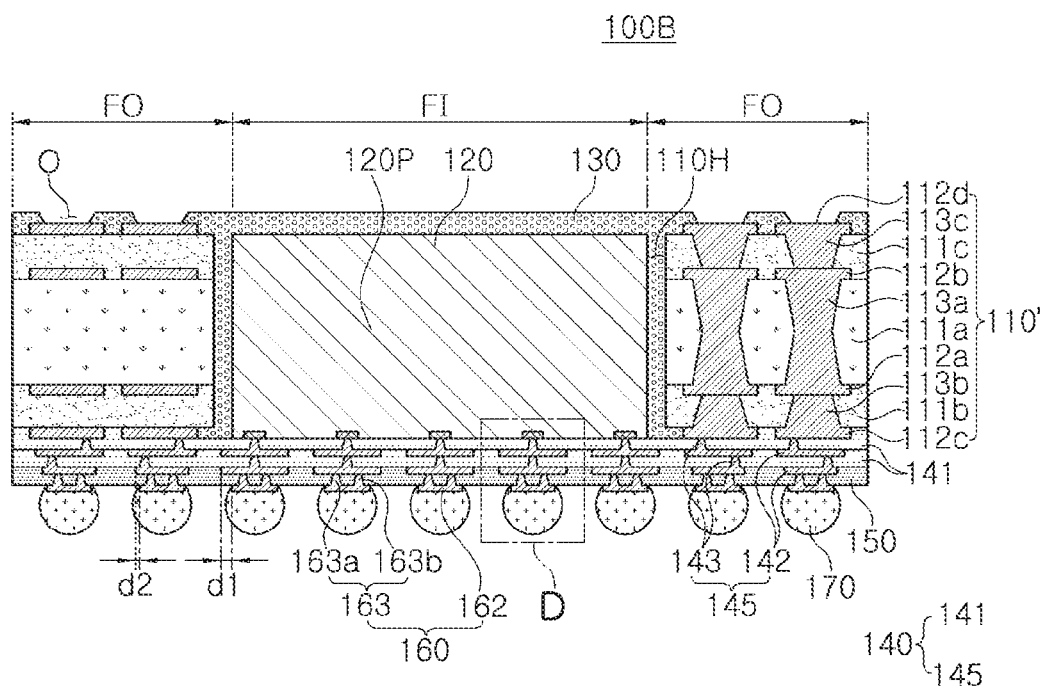
FIG. 16 is a schematic cross-sectional view of a semiconductor package according to an exemplary embodiment of the present disclosure.
Figure 17:
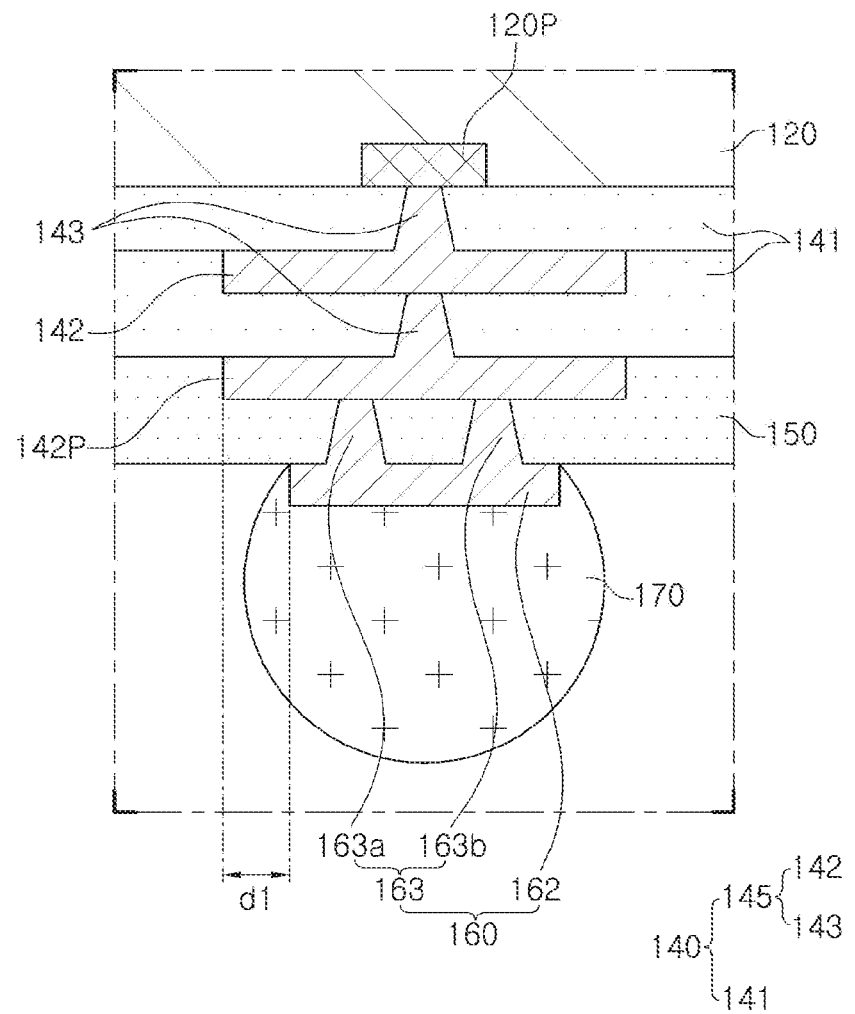
FIG. 17 is an enlarged cross-sectional view illustrating a portion D of the semiconductor package illustrated in FIG. 16.

FIG. 16 is a schematic cross-sectional view illustrating a semiconductor package according to an exemplary embodiment, and FIG. 17 is an enlarged cross-sectional view illustrating a portion D of the semiconductor package illustrated in FIG. 16.

Referring to FIG. 16, a semiconductor package 100B according to an exemplary embodiment may be understood to be similar to the structure illustrated in FIG. 9, except that a supporting member 110' having a wiring structure is included and a UBM via is provided as a double via. The description of the components according to an exemplary embodiment may be referred to the description of the same or similar components of the semiconductor package 100 illustrated in FIG. 9, unless specifically explained otherwise.

The semiconductor package 100B according to an exemplary embodiment may include the supporting member 110' having a cavity 110H for embedding a semiconductor chip 120. The supporting member 110' is disposed above the connection member 140 and has a wiring structure connected to the redistribution layer 145.

The supporting member 110', applied to an exemplary embodiment, may include a first dielectric layer 111a, a first wiring layer 112a and a second wiring layer 112b disposed on both surfaces of the first dielectric layer 111a, a second dielectric layer 111b disposed on the first insulating layer 112a and covering the first wiring layer 112a, a third wiring layer 112c disposed on the second dielectric layer 111b, a third dielectric layer 111c disposed on the first dielectric layer 111a and covering the second wiring layer 112b, and a fourth wiring layer 112d disposed on the third dielectric layer 111c. The first wiring layer 112a, the second wiring layer 112b, the third wiring layer 112c, and the fourth wiring layer 112d may be electrically connected to the connection pad 120P of a semiconductor chip 120 through the redistribution layer 145.

The supporting member 110' may include the greater number of wiring layers, for example, the first wiring layer 112a, the second wiring layer 112b, the third wiring layer 112c, and the fourth wiring layer 112d, so the connection member 140 may be further simplified. Therefore, a decrease in a yield depending on a defect occurring in a process of forming the connection member 140 may be suppressed.

Meanwhile, the first wiring layer 112a, the second wiring layer 112b, the third wiring layer 112c, and the fourth wiring layer 112d may be electrically connected to each other through a first via 113a, a second via 113b, and a third via 113c, passing through a first via 111a, a second via 111b, and a third via 111c, respectively.

The first dielectric layer 111a may have a thickness greater than those of the second dielectric layer 111b and the third dielectric layer 111c. The first dielectric layer 111a may be basically relatively thick in order to maintain rigidity, and the second dielectric layer 111b and the third dielectric layer 111c may be introduced in order to form a larger number of wiring layers 112c and 112d. The first dielectric layer 111a may include an insulating material different from those of the second dielectric layer 111b and the third dielectric layer 111c. For example, the first dielectric layer 111a may be, for example, prepreg including a core, a filler, and an insulating resin, and the second dielectric layer 111b and the third dielectric layer 111c may be an ABF or a PID film including a filler and an insulating resin. However, the materials of the first dielectric layer 111a and the second and third dielectric layers 111b and 111c are not limited thereto.

The first via 113a passing through the first dielectric layer 111a may have a diameter greater than those of the second via 113b and the third via 113c passing through the second dielectric layer 111b and the third dielectric layer 111c.

A lower surface of the third wiring layer 112c of the supporting member 110' may be located below a lower surface of the connection pad 120P of the semiconductor chip 120. In addition, a distance between a redistribution layer 142 of the connection member 140 and the third wiring layer 112c of the supporting member 110' may be smaller than that between the redistribution layer 142 of the connection member 140 and the connection pad 120P of the semiconductor chip 120.

In an exemplary embodiment, the third wiring layer 112c may be disposed to protrude from the second dielectric layer 111b. As a result, the third wiring layer may be in contact with the connection member 140. The first wiring layer 112a and the second wiring layer 112b of the supporting member 110' may be located between an active surface and an inactive surface of the semiconductor chip 120. As the supporting member 110' may be provided to correspond to a thickness of the semiconductor chip 120, the first wiring layer 112a and the second wiring layer 112b, located in the supporting member 110', may be disposed on a level between the active surface and the inactive surface of the semiconductor chip 120.

As illustrated in FIG. 17, a UBM layer 160, applied to an exemplary embodiment, may include two UBM vias 163a and 163b, connecting a UBM pad 162 to an associated connection pad 142P. In another exemplary embodiment, a UBM via 163 of each UBM layer 160 may be provided as a plurality of UBM vias, such as, three or more UBM vias.

In an exemplary embodiment, the connection pad 142P, located in a fan-in region FI overlapping the semiconductor chip 120, may have an area larger than an area of an associated UBM pad 162 by a first expansion width d1 while the associated UBM pad 162 overlaps in a stacking direction. A width d1 of the connection pad 142P may be 20 μm or more. The connection pad 142P may have a diameter which is greater than a diameter of the associated UBM pad by 40% or more. On the other hand, the connection pad 142P, located in the fan-out region FO, may be extended by a second expansion width d2, less than the first expansion width d1, and may thus have an area smaller even than an area of the connection pad 142P of the fan-in region FI.

In the fan-in region FI, rather than the fan-out region FO, the connection pad 142P may be sufficiently expanded. As described above, by selectively differently expanding a connection pad in consideration of other thermal environments, crack propagation and defects may be effectively reduced within a limited design area.

As set forth above, according to an exemplary embodiment, an area of a connection pad, located in a fan-in region, is expanded, so cracking, occurring from a triple contact point of a UBM pad (or a UBM layer), an electrical connection structure, and a passivation layer, may be blocked from being propagated to a redistribution layer. As a result, thermal reliability of a semiconductor package may be significantly improved.

While exemplary embodiments have been shown and described above, it will be apparent to those skilled in the art that modifications and variations could be made without departing from the scope of the present invention as defined by the appended claims.

What is claimed is:
1. A semiconductor package, comprising:
a connection member having a first surface and a second surface opposing each other, and including a plurality of connection pads located on the second surface and a redistribution layer connected to the plurality of connection pads;
a semiconductor chip disposed on the first surface of the connection member and having a connecting electrode connected to the redistribution layer;
an encapsulant disposed on the first surface of the connection member and sealing the semiconductor chip;
an insulating layer disposed on the second surface of the connection member;
a plurality of under bump metallurgy (UBM) pads disposed on the insulating layer;
a plurality of UBM vias passing through the insulating layer, and connecting the plurality of UBM pads to the plurality of connection pads, respectively; and
a plurality of electrical connection structures disposed on the plurality of UBM pads, respectively, wherein each of the plurality of connection pads has an area larger than an area of an associated UBM pad, and has a first region overlapped with the associated UBM pad in a stacking direction and a second region not overlapped with the associated UBM pad in the stacking direction and surrounding the first region, and wherein the second region has a width extending by at least 20 μm from a boundary of the first region and each of the plurality of connection pads has a diameter 1.4 or more times a diameter of the associated UBM pad.

2. The semiconductor package of claim 1, wherein each of the plurality of connection pads has a diameter, 40% or more, greater than a diameter of the associated UBM pad.

3. The semiconductor package of claim 1, wherein each of the plurality of connection pads has a diameter 1.5 to 2 times a diameter of the associated UBM pad.

4. The semiconductor package of claim 1, wherein each of the plurality of connection pads is disposed to have a distance with an adjacent connection pad to be at least 10 μm.

5. The semiconductor package of claim 1, wherein the plurality of electrical connection structures are connected to contact points of the UBM pads and the insulating layer.

6. The semiconductor package of claim 5, wherein each of the plurality of connection pads has a region in which the contact point is overlapped in the stacking direction.

7. The semiconductor package of claim 1, wherein the connection member further includes an insulating member, and the redistribution layer includes a plurality of redistribution layers located on a level different from a level of the insulating member.

8. The semiconductor package of claim 1, wherein the plurality of UBM vias are provided as two or more UBM vias disposed in a single UBM pad.

9. The semiconductor package of claim 1, further comprising: a supporting member disposed on the first surface of the connection member, and having a cavity accommodating the semiconductor chip.

10. The semiconductor package of claim 9, wherein the supporting member has a wiring structure connecting an upper surface to a lower surface of the supporting member, and
the wiring structure is connected to the redistribution layer of the connection member.

11. A semiconductor package, comprising:
a connection member having a first surface and a second surface opposing each other, and including a plurality of connection pads located on the second surface and a redistribution layer connected to the plurality of connection pads;
a semiconductor chip disposed on the first surface of the connection member and having a connecting electrode connected to the redistribution layer;
an encapsulant disposed on the first surface of the connection member and sealing the semiconductor chip;
an insulating layer disposed on the second surface of the connection member;
a plurality of UBM pads disposed on the insulating layer and electrically connected to the plurality of connection pads; and
a plurality of electrical connection structures disposed on the plurality of UBM pads, respectively,
wherein each of the plurality of connection pads has an area larger than an area of an associated UBM pad, and has a first region overlapped with the associated UBM pad in a stacking direction and a second region not overlapped with the associated UBM pad in the stacking direction and surrounding the first region,
wherein each of the plurality of connection pads has a diameter 1.4 or more times a diameter of the associated UBM pad, when the redistribution layer is arranged such that a gap between adjacent connection pads of the plurality of connection pads is at least 10 μm.

12. The semiconductor package of claim 11, wherein each of the plurality of UBM pads has a perimeter region connected to the insulating layer and the electrical connection structure disposed on the UBM pad.

13. The semiconductor package of claim 12, wherein each of the plurality of connection pads is overlapped with the perimeter region in the stacking direction.

14. A semiconductor package, comprising:
a connection member having a first surface and a second surface opposing each other, and including a plurality of connection pads located on the second surface and a redistribution layer connected to the plurality of connection pads;
a semiconductor chip disposed on the first surface of the connection member and having a connecting electrode connected to the redistribution layer;
an encapsulant disposed on the first surface of the connection member and sealing the semiconductor chip;
a passivation layer disposed on the second surface of the connection member;
a plurality of under bump metallurgy (UBM) pads disposed on the passivation layer;
a plurality of UBM vias passing through the passivation layer, and connecting the plurality of UBM pads to the plurality of connection pads, respectively; and
a plurality of electrical connection structures disposed on the plurality of UBM pads, respectively,
wherein the plurality of UBM pads include a first UBM pad located in a region overlapped with the semiconductor chip in a stacking direction of the semiconductor chip and the connection member and a second UBM pad located outside of the overlapped region,
the plurality of connection pads include a first connection pad associated with the first UBM pad and a second connection pad associated with the second UBM pad,
the first connection pad has a first area extending by at least 20 μm from a boundary of a second area overlapped with the associated first UBM pad, and a diameter 1.4 or more times a diameter of the first UBM pad, and
the first area of the first connection pad is greater than the a third region of the second connection pad.

15. The semiconductor package of claim 14, wherein a third area of the second connection pad extends outward from a boundary of a fourth area overlapped with the associated second UBM pad.

16. The semiconductor package of claim 14, wherein the first connection pad has a diameter 1.4 to 1.75 times a diameter of the associated first UBM pad, when the redistribution layer is disposed in a gap with adjacent connection pads of the plurality of connection pads.

17. The semiconductor package of claim 16, wherein the redistribution layer is disposed in the gap with the adjacent connection pads of the plurality of connection pads.

18. The semiconductor package of claim 14, wherein the first connection pad has a diameter 1.5 to 2 times a diameter of the associated first UBM pad.

19. The semiconductor package of claim 18, wherein the redistribution layer is not disposed in a gap with adjacent connection pads of the plurality of connection pads.

20. The semiconductor package of claim 14, wherein the first connection pad is disposed to have a distance with an adjacent first connection pad to be at least 10 pm.

* * * * *